(12) United States Patent
Lu et al.

(10) Patent No.: US 10,706,782 B2
(45) Date of Patent: Jul. 7, 2020

(54) TFT PIXEL THRESHOLD VOLTAGE COMPENSATION CIRCUIT WITH SHORT ONE HORIZONTAL TIME

(71) Applicant: Sharp Kabushiki Kaisha, Osaka (JP)

(72) Inventors: Tong Lu, Oxford (GB); Michael James Brownlow, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/171,718

(22) Filed: Oct. 26, 2018

(65) Prior Publication Data

US 2020/0135105 A1    Apr. 30, 2020

(51) Int. Cl.
    *G09G 3/3258*    (2016.01)
    *H01L 27/12*    (2006.01)
    *G09G 3/3233*    (2016.01)

(52) U.S. Cl.
    CPC .......... *G09G 3/3258* (2013.01); *G09G 3/3233* (2013.01); *H01L 27/1214* (2013.01)

(58) Field of Classification Search
    CPC ...... G09G 3/32; G09G 3/3258; G09G 3/3233; H01L 27/1214
    See application file for complete search history.

(56) References Cited

U.S. PATENT DOCUMENTS

| | | | |
|---|---|---|---|
| 7,277,071 B2 | 10/2007 | Oh | |
| 7,317,435 B2 | 1/2008 | Hsueh | |
| 7,414,599 B2 | 8/2008 | Chung et al. | |
| 9,455,311 B2 | 9/2016 | Shishido | |
| 9,773,449 B2 | 9/2017 | Lin et al. | |
| 2005/0287750 A1* | 12/2005 | Lee | G09G 3/3233 438/301 |
| 2014/0139566 A1* | 5/2014 | Han | G09G 3/003 345/691 |
| 2018/0151115 A1* | 5/2018 | Tseng | G09G 3/3275 |

* cited by examiner

*Primary Examiner* — Alexander Eisen
*Assistant Examiner* — Cory A Almeida
(74) *Attorney, Agent, or Firm* — Renner, Otto, Boisselle & Sklar, LLP

(57) ABSTRACT

A pixel circuit includes a drive transistor that controls an amount of current to a light-emitting device, and a second transistor connected to the gate of the drive transistor and a second terminal of the drive transistor, such that when the second transistor is in an on state the drive transistor becomes diode-connected. A threshold voltage of the drive transistor is compensated during a compensation phase while the drive transistor is diode connected. The light-emitting device is connected between the drive transistor and at a second node to a first voltage input. The pixel circuit further includes a storage capacitor having a first plate connected to the gate of the drive transistor, and a programming capacitor having a first plate connected to a second plate of the storage capacitor, and a second plate of the programming capacitor is electrically connected to a data voltage input during a data programming phase. The second plate of the storage capacitor and the first plate of the programming capacitor are connectable to a reference voltage to perform the compensation phase independently of the programming phase, and the storage capacitor and the programming capacitor are series connected during the emission phase.

20 Claims, 8 Drawing Sheets

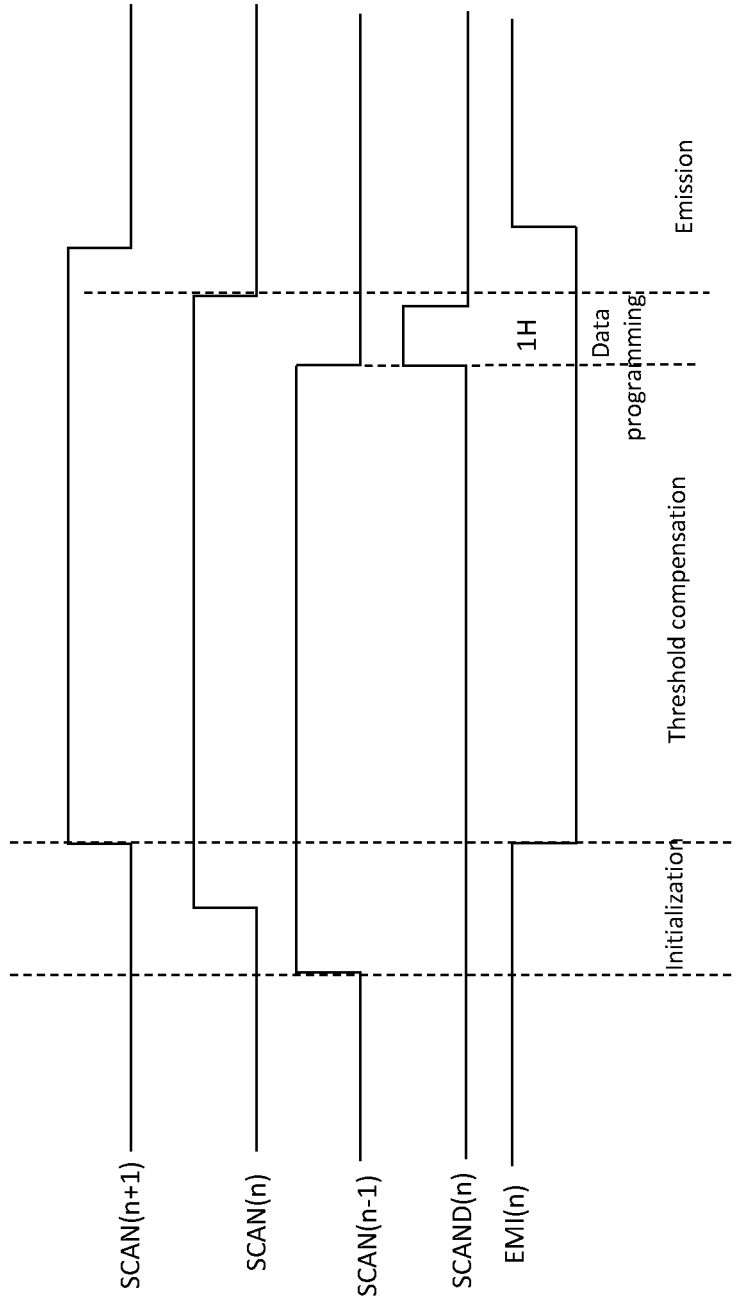

TFT PIXEL THRESHOLD VOLTAGE COMPENSATION CIRCUIT WITH SHORT ONE HORIZONTAL TIME

TECHNICAL FIELD

The present invention relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through a drive transistor. In one example, an input signal, such as a high "SCAN" signal, is employed to switch transistors in the circuit to permit a data voltage, VDAT, to be stored at a storage capacitor during a programming phase. When the SCAN signal is low and the switch transistors isolate the circuit from the data voltage, the VDAT voltage is retained by the capacitor and this voltage is applied to a gate of a drive transistor. With the drive transistor having a threshold voltage $V_{TH}$, the amount of current to the OLED is related to the voltage on the gate of the drive transistor by:

$$I_{OLED} = \frac{\beta}{2}(V_{DAT} - V_{OLED} - V_{TH})^2$$

TFT device characteristics, especially the TFT threshold voltage $V_{TH}$, may vary with time or among comparable devices, for example due to manufacturing processes or stress and aging of the TFT device over the course of operation. With the same VDAT voltage, therefore, the amount of current delivered by the drive TFT could vary by a large amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistors. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

The threshold compensation time is decided by the drive transistor's characteristics, which may require long compensation time for high compensation accuracy. For the data programming time, the RC constant time required for charging the programming capacitor is determinative of the programming time. As is denoted in the art, the one horizontal (1H) time is the time that it takes for the data to be programmed for one row.

With such circuit configuration as in U.S. Pat. No. 7,414,599, the data is programmed at the same time as when the threshold voltage of the drive transistor is compensated. It is desirable, however, to have as short of a one horizontal time as possible to enhance the responsiveness and operation of the display device. This is because each row must be programmed independently, whereas other operations, such as for example drive transistor compensation, may be performed for multiple rows simultaneously. The responsiveness of the display device, therefore, tends to be dictated most by the one horizontal time for programming. When the data is programmed during the same operational phase as the drive transistor is compensated, the one horizontal time cannot be reduced further due to compensation accuracy requirements for the drive transistor, as the compensation requirements limit any time reductions for the programming phase.

Another approach is described in U.S. Pat. No. 7,277,071 (Choon-Vul Oh, issued Oct. 2, 2007). In such circuit, two capacitors are used, one for storing the programmed data voltage and the other one for storing the threshold voltage of the drive transistor. In this way, the one horizontal time is dictated by the data programming time only, but this scheme does not use the advantage of independent programming time to minimize the one horizontal time. The configuration uses the same scan signal in the consecutive rows for threshold voltage compensation and data programming. Hence, the one horizontal time is still dependent upon the threshold compensation time.

Other approaches to address the above problems have proven deficient. U.S. Pat. No. 7,317,435 (Wei-Chieh Hsueh., issued Jan. 8, 2008) describes a similar scheme of using two capacitors, one for storing the programmed data voltage and the other one for storing the threshold voltage. The data programming time is reduced as compared to the threshold compensation time. The data line, however, also supplies a reference voltage for "Reset" and "Compensation" phases, and the data line thus cannot be used by other rows during the above two phases. Accordingly, the effective one horizontal time is not actually reduced in a meaningful manner over conventional configurations.

U.S. Pat. No. 9,455,311 (Hideaki Shishido, issued Sep. 27, 2016) describes a scheme with a longer the threshold compensation time and a shorter data programming phase performed at the end of the threshold compensation phase. Hence, a shorter one horizontal time is achieved. A disadvantage of this scheme, however, is that when data is programmed, the programming operation can disturb the compensated threshold voltage and compromise the accuracy of threshold compensation. U.S. Pat. No. 9,773,449 (Yung-Ming Lin, issued Sep. 26, 2017) describes a similar scheme by which data is programmed after threshold voltage compensation. The data programming does not disturb the threshold compensation, but a disadvantage of this scheme is that the terminal of the capacitor for data programming is floating during the emission phase. The noise from the data line could couple to the programming capacitor, so the gate voltage of the drive transistor could be affected by this noise during the emission phase. Hence, the OLED current could be disturbed by the noise from the data line.

SUMMARY OF INVENTION

The present invention relates to pixel circuits that are capable of compensating the threshold voltage variations of the drive transistor with an ultra-short one horizontal time 1H of less than about 2 μs, which is shorter as compared to conventional configurations, with additionally removing the possible memory effects associated with the OLED device and drive transistor from the previous frame.

An ultra-short 1H time (<2 μs) is achieved via separation of threshold compensation of the drive transistor and data programming phases. The threshold compensation time is decided by the drive transistor characteristics and is difficult to reduce further without degrading the compensation accuracy. By separating the threshold compensation and data programming phases, a longer time can be allocated to threshold compensation for compensation accuracy. As referenced above, the RC constant time required for charging the programming capacitor is determinative of the programming time, and such programming time can be reduced to ultra-short 1H times (<2 μs).

To achieve such results, a two-capacitor in-series structure is used for the threshold compensation and the data programming phases, with one capacitor used for threshold compensation and the other capacitor used for data programming. The sum of the two voltages of the capacitors is applied at the gate of the drive transistor for emission during the emission phase. The threshold compensation and data programming operations are independent of each other. In addition, the data programming phase can be performed during any portion of the overall SCAN period of a frame, such as before the threshold compensation phase, during the threshold compensation phase whereby the data programming phase overlaps the compensation phase, or after the threshold compensation phase. The described configurations also prevent data line noise from interfering with the voltage at the drive transistor gate during emission.

An aspect of the invention, therefore, is a pixel circuit for a display device operable in a compensation phase, a programming phase, and an emission phase, whereby the one horizontal time is minimized while maintaining accurate compensation of the threshold voltage of the drive transistor. In exemplary embodiments, the pixel circuit includes: a drive transistor configured to control an amount of current to a light-emitting device during the emission phase depending upon a voltage applied to a gate of the drive transistor; and a second transistor connected to the gate of the drive transistor and a second terminal of the drive transistor, such that when the second transistor is in an on state the drive transistor becomes diode-connected such that the gate and the second terminal of the drive transistor are connected through the second transistor, wherein a threshold voltage of the drive transistor is compensated during the compensation phase while the drive transistor is diode connected. The light-emitting device is connected at a first node to the second terminal of the drive transistor and at a second node to a first voltage input. The pixel circuit further includes a storage capacitor having a first plate connected to the gate of the drive transistor, and a programming capacitor having a first plate connected to a second plate of the storage capacitor, and a second plate of the programming capacitor is electrically connected to a data voltage input during the data programming phase. The second plate of the storage capacitor and the first plate of the programming capacitor are connectable to a reference voltage to perform the compensation phase independently of the programming phase, and the storage capacitor and the programming capacitor are series connected during the emission phase.

Another aspect of the invention is a method of operating a pixel circuit accordingly to any of the embodiments, whereby the one horizontal time is minimized while maintaining accurate compensation of the threshold voltage of the drive transistor. In exemplary embodiments, the method of operating includes the steps of providing a pixel circuit according to any of the embodiments; performing a compensation phase to compensate a threshold voltage of the drive transistor comprising diode-connecting the drive transistor through the second transistor and a applying the reference voltage at the second plate of the storage capacitor and the first plate of the programming capacitor, and at the second plate of the programming capacitor, thereby electrically isolating the programming capacitor from the storage capacitor; performing a data programming phase to program the data voltage to the programming capacitor comprising applying the data voltage at a second plate of the programming capacitor; and performing an emission phase during which light is emitted from the light-emitting device comprising applying the reference voltage at the second terminal of the programming capacitor, wherein the storage capacitor and the programming capacitor are series-connected to the gate of the drive transistor, and applying a driving voltage through the drive transistor to the light emitting device. A duration of the data programming phase is shorter than a duration of the compensation phase, and the data programming phase may overlap the compensation phase.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 8 is a drawing depicting a timing diagram associated with the operation of the circuit of FIG. 7.

DESCRIPTION OF EMBODIMENTS

Figure 1:
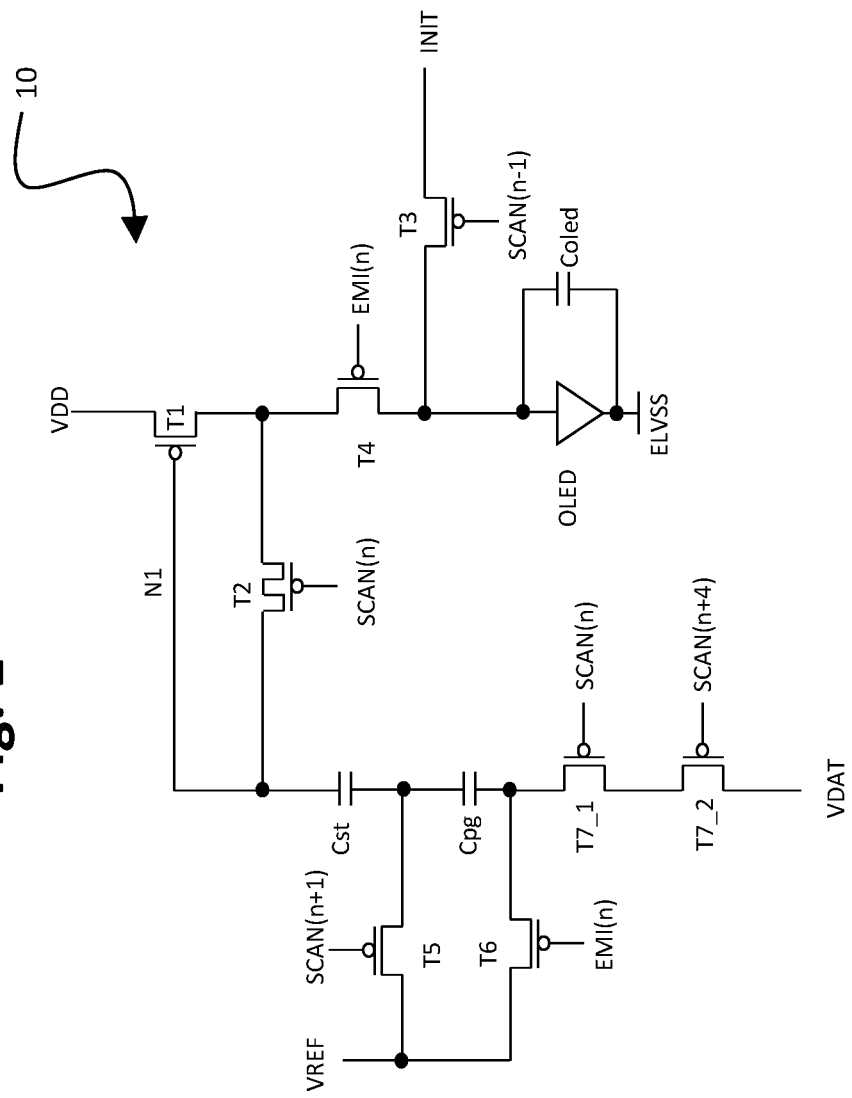
FIG. 1 is a drawing depicting a first circuit configuration in accordance with embodiments of the present invention.

Embodiments of the present invention will now be described with reference to the drawings, wherein like reference numerals are used to refer to like elements throughout. It will be understood that the figures are not necessarily to scale.

Figure 2:
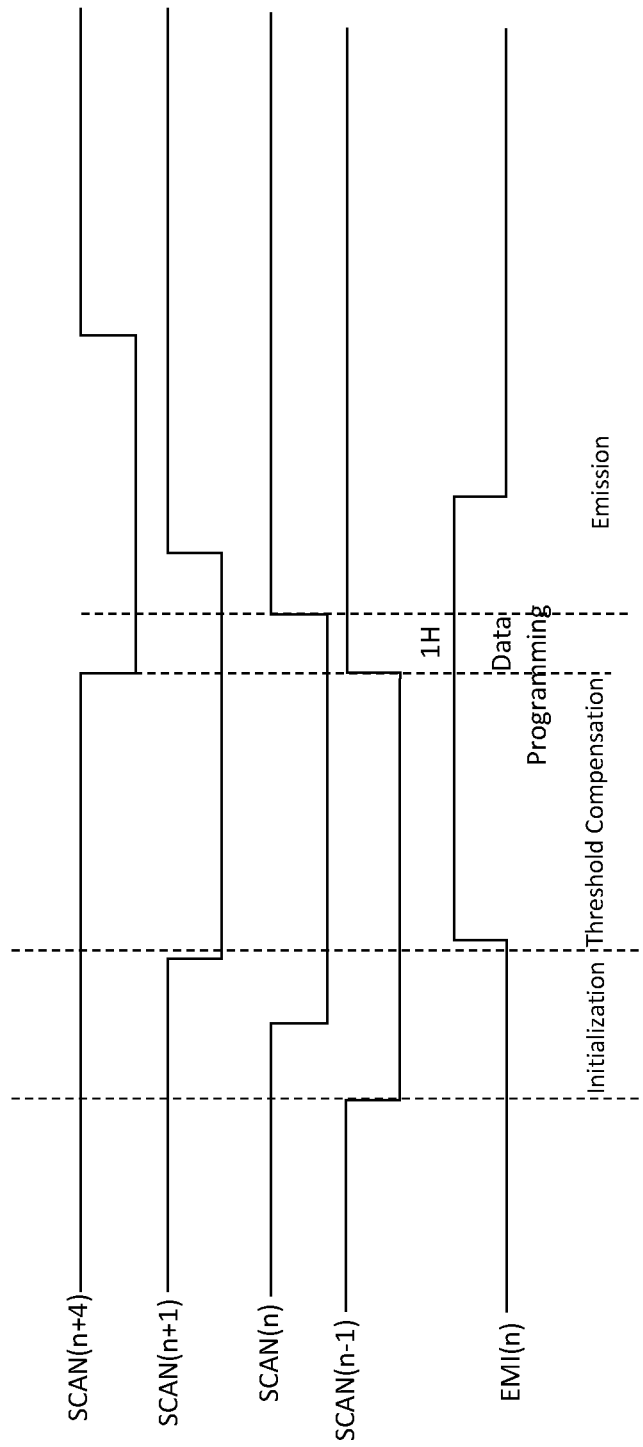
FIG. 2 is a drawing depicting a timing diagram associated with the operation of the circuit of FIG. 1.

FIG. 1 is a drawing depicting a first circuit configuration 10 in accordance with embodiments of the present invention, and FIG. 2 is a timing diagram associated with the operation of the circuit configuration 10 of FIG. 1. In this example, the circuit 10 is configured as a TFT circuit that includes multiple p-type transistors T1-T7_2 and two capacitors including a storage $C_{st}$ and a programming capacitor $C_{pg}$. The circuit elements drive a light-emitting device, such as for example an OLED. The light-emitting device (OLED) has an associated internal capacitance, which is represented in the circuit diagram as $C_{oled}$. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 1 depicts the TFT circuit 10 configured with multiple p-MOS or p-type TFTs. T1 is a drive transistor that is an analogue TFT, and T2-T7_2 are digital switch TFTs. In this exemplary embodiment, T2 is a double-gate TFT as a preferred embodiment, which have low leakage between source and drain, although T2 alternatively may be a single gate TFT. As referenced above, $C_{st}$ and $C_{pg}$ are capacitors, with $C_{st}$ also being referred to as the storage capacitor and $C_{pg}$ also being referred to as the programming capacitor. $C_{oled}$ is the internal capacitance of the OLED device (i.e., $C_{oled}$ is not a separate component, but is inherent to the OLED). The OLED further is connected to a first power supply ELVSS as is conventional.

The OLED and the TFT circuit 10, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 10 (and subsequent embodiments) may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitors each may comprise a first electrode, an insulating layer and a second electrode, whereby the insulating layer forms an insulating barrier between the first and second electrodes. Wiring between components in the circuit, and wiring used to introduce signals to the circuit (e.g. SCAN, EMI, VDATA, INIT) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

The OLED device may be disposed over the TFT circuit. The OLED device may comprise a first electrode (e.g. anode of the OLED), which is connected to transistors T3 and T4 in this example, one or more layers for injecting or transporting charge (e.g. holes) to an emission layer, an emission layer, one or more layers for injecting or transporting electrical charge (e.g. electrons) to the emission layer, and a second electrode (e.g. cathode of the OLED), which is connected to first power supply ELVSS in this example. The injection layers, transport layers and emission layer may be organic materials, the first and second electrodes may be metals, and all of these layers may be deposited by a thermal evaporation technique.

Referring to the TFT circuit 10 of FIG. 1 in combination with the timing diagram of FIG. 2, the TFT circuit 10 operates to perform in four phases: an initialization phase, a threshold compensation phase, a data programming phase, and an emission phase for light emission. The time period for performing the programming phase is referred to in the art as the "one horizontal time" or "1H" time as illustrated in the timing diagram and in subsequent the timing diagrams. A short 1H time is a requirement for displays with a large number of pixels in a column, as is necessary for high-resolution displays. As referenced above, a short one horizontal time is significant because each row must be programmed independently, whereas other operations, such as for example drive transistor threshold compensation, may be performed for multiple rows simultaneously. The responsiveness of the device, therefore, tends to be dictated most by the one horizontal time for programming.

Generally, this embodiment has comparable control signals EMI and SCAN for other rows of pixels in the overall or broader display device, thereby enabling fewer control signal wires in a display configuration as common control lines may be shared over different rows. For this example and in subsequent embodiments, display pixels are addressed by row and column. The current row is row n. The previous row is row n−1, and the second previous row is n−2. The next row is row n+1, and the row after that is row n+2, and so on for the various rows as they relate to the corresponding control signals identified in the figures. Accordingly, for example, SCAN(n) refers to the scan signal at row n and SCAN(n+1) refers to the scan signal at row n+1, and the like. EMI(n) refers to the emission signal at row n and EMI(n−1) refers to the emission signal at row n−1, and the like, and so on for the various control signals. In this manner, for the various embodiments the input signals correspond to the indicated rows.

In this first embodiment, during the previous emission phase, the EMI(n) signal level has a low voltage value, so transistors T4 and T6 are on, and light emission is being driven by the input driving voltage VDD connected to the drive transistor T1, whereby the actual current applied to the OLED is determined by the voltage at the gate of the drive transistor. The SCAN signal levels initially have a high voltage value so transistors T2, T3, T5, T7_1 and T7_2 are off. Next at the beginning of the initialization phase, the SCAN(n−1) signal level is changed from a high voltage value to a low voltage value, causing transistor T3 to be turned on. An initialization voltage, INIT, is applied at the anode of the OLED. The INIT voltage is set to lower than the threshold voltage of the OLED, and thus the INIT voltage does not cause light emission when applied at anode of the OLED. The application of the initialization voltage in the various embodiments operates to clear memory effects from the previous frame.

Next during the initialization phase, the SCAN(n) signal level is changed from a high voltage value to a low voltage value, causing transistors T2 and T7_1 to be turned on. As transistor T2 is turned on, the top plate of the storage capacitor, Cat, and thus also the gate of the drive transistor (node N1), is connected to the INIT voltage through transistors T4 and T3. The node N1 is initialized to the initialization voltage, INIT. Consequently, the drive transistor T1 is "diode-connected" through transistor T2. Diode-connected refers to the drive transistor T1 being operated with its gate and a second terminal (e.g., source or drain) being electrically connected, such that current flows in one direction. The transistor T7_1 is turned on and ready for the data programming phase.

Next the SCAN (n+1) signal level is changed from the high voltage value to the low voltage value. The bottom plate of the storage capacitor, $C_{st}$, and the top plate of the programming capacitor, $C_{pg}$, are electrically connected to the reference voltage VREF. Effectively, the VREF electrically isolates the storage capacitor, $C_{st}$, from the programming capacitor, $C_{pg}$. With the two capacitors effectively isolated from each other, the threshold compensation and data programming phases can be performed independently of each other, which permits minimizing the one horizontal time as desired, while maintaining accurate and effective threshold compensation.

The TFT circuit 10 next is operable in a threshold compensation phase, during which the threshold voltage of the drive transistor T1 is compensated. For such phase, the EMI(n) signal level is changed from a low voltage value to a high voltage value, causing transistors T4 and T6 to be turned off. As transistor T4 is turned off, the drain and gate of the diode-connected transistor T1 and the top plate of the storage capacitor, $C_{st}$, thus are disconnected from the anode of the OLED, thereby electrically isolating the OLED. As the transistor T6 is turned off, the bottom plate of the programming capacitor, $C_{pg}$, is disconnected from the reference voltage, VREF, and becomes floating so that threshold compensation and programming may be performed independently of each other.

Preferably, to have effective voltage threshold compensation of the drive transistor T1, the voltage at the gate of the drive transistor should satisfy the following condition:

$$V_{DD}-V_{N1}>|V_{TH}|+\Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

The TFT circuit 10 next is operable in a data programming phase. The SCAN(n+4) signal level is changed from the high voltage value to the low voltage value, causing transistor T7_2 to be turned on, which electrically connects the data voltage input to the programming capacitor. The data signal thus is applied at the bottom plate of the data programming capacitor, $C_{pg}$. The data voltage, VDAT, is changed from the value for another pixel (e.g. the previous row of the display DATA(n−1)) to the data value for the current pixel (e.g. the current row of the display DATA(n)), which is applied to the data programming capacitor, $C_{pg}$. Then the SCAN(n) signal level is changed from the low voltage value to the high voltage value, causing transistors T2 and T7_1 to be turned off. With T7_1 turning off, the bottom plate of the capacitor, $C_{pg}$, is disconnected from the data line. As the top plate of the programming capacitor is connected to the reference voltage, the data voltage has been programmed to the data programming capacitor. With T2 turning off, the drive transistor is no longer diode-connected, and the node "N1" is floating. The voltage at the gate of the drive transistor is $V_{DD}-|V_{TH}|$. VDAT then may be set to a data value for a next pixel DATA(n+1).

For the programming phase, SCAN signals applied to different rows (e.g., SCAN(n+1) and SCAN(n+4)) are employed to electrically connect the data voltage VDAT to the bottom plate of the programming capacitor $C_{pg}$. By using SCAN signals from different rows in combination, a short programming pulse results from overlap of the SCAN signals, thereby minimizing the 1H time as shown in the timing diagram of FIG. 2. Although in this embodiment, the SCAN (n) and SCAN (n+4) are used to control the switch transistors T7_1 and T7_2 to generate the short programming pulse, the SCAN signals from other rows can be used. The generated short programming pulse can be applied any time during which the VREF electrically isolates the storage capacitor, $C_{st}$, from the programming capacitor, $C_{pg}$. This embodiment has an advantage of using existing SCAN signal lines, but requires the two transistors T7_1 and T7_2 to connect VDAT to the programming capacitor $C_{pg}$ during the programming phase.

The TFT circuit 10 next is operable in an emission phase during which the OLED is capable of emitting light. The SCAN(n+1) signal level is changed from the low voltage value to the high voltage value, causing transistor T5 to be turned off, and accordingly the capacitors $C_{st}$ and $C_{pg}$ become series connected to the gate of the drive transistor T1. Then the EMI(n) signal is changed from the high voltage value to the low voltage value, causing transistors T6 and T4 to be turned on. With transistor T6 turning on, the VREF is applied at the bottom plate of the capacitor $C_{pg}$. The voltage at the bottom plate of the capacitor $C_{pg}$ is changed from VDAT to VREF. As the capacitors Cst and $C_{pg}$ are now series connected and the top plate is floating, the same amount of voltage $V_{REF}-V_{DAT}$ is changed at the top of the storage capacitor $C_{st}$ through the series connection of the programming capacitor $C_{pg}$.

With this voltage change, the gate voltage of the drive transistor T1 becomes $$V_{DD}-|V_{TH}|V_{REF}-V_{DAT}$$

With transistor T4 turning on, the drain of the drive transistor T1 is connected to the anode of the OLED. The current that flows through the OLED is $$I_{OLED}=\frac{\beta}{2}(V_{DD}+V_{TH}+V_{REF}-V_{DAT}-V_{DD}-V_{TH})^2=\frac{\beta}{2}(V_{REF}-V_{DAT})^2$$

$$\text{where } \beta=\mu_n \cdot C_{ox} \cdot \frac{W}{L},$$

$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Figure 3:
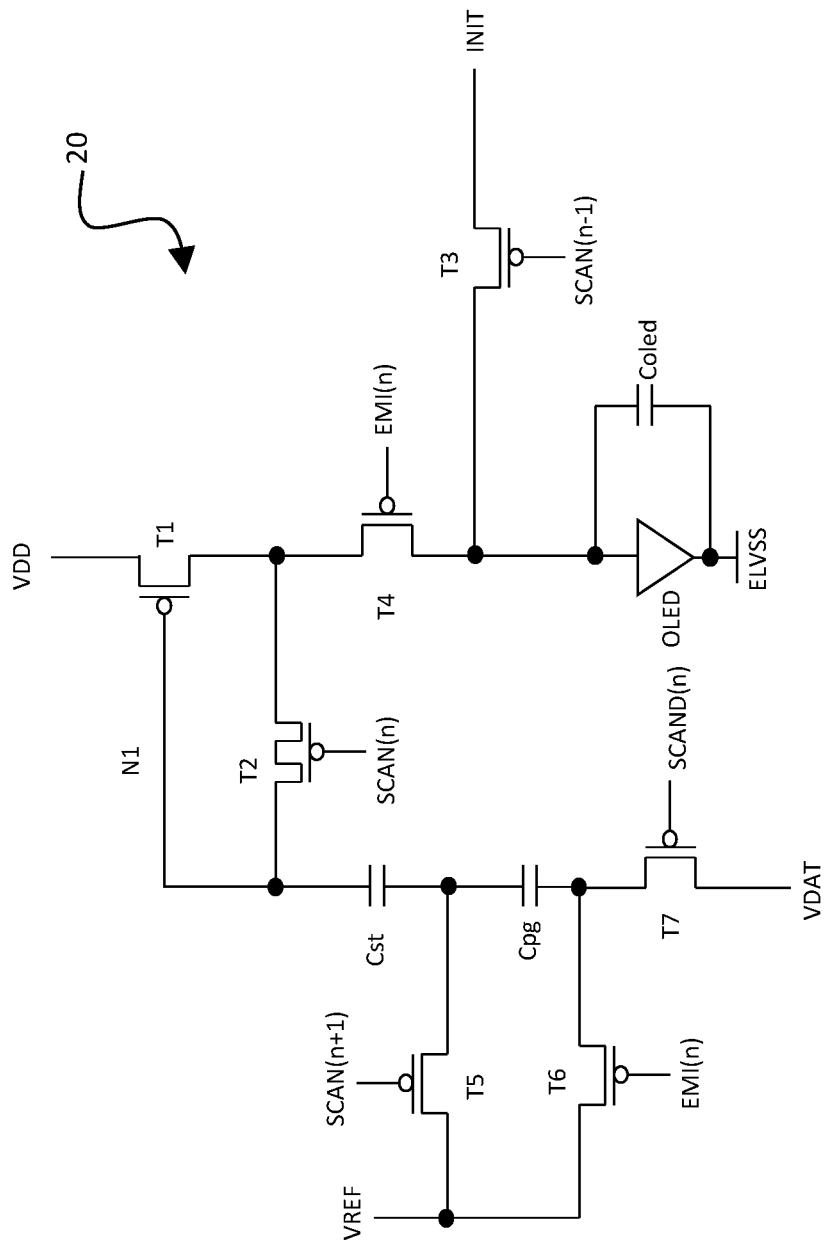
FIG. 3 is a drawing depicting a second circuit configuration in accordance with embodiments of the present invention.
Figure 4:
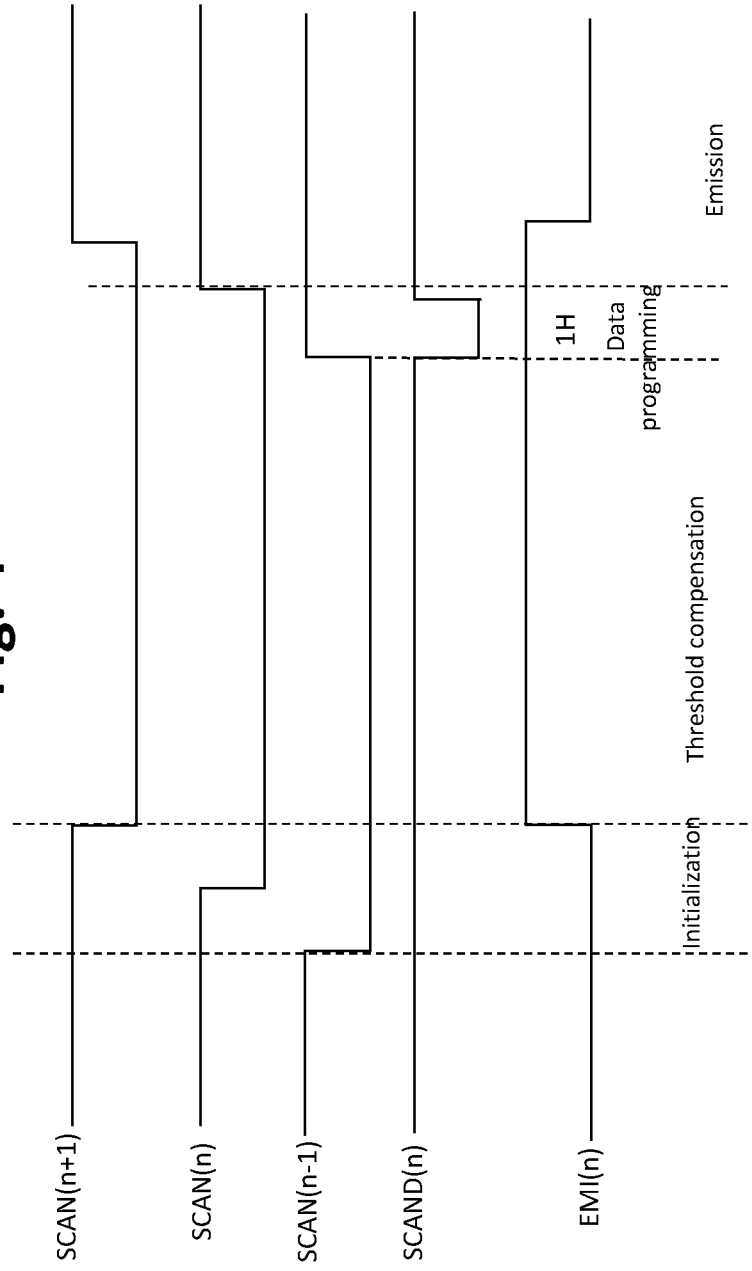
FIG. 4 is a drawing depicting a timing diagram associated with the operation of the circuit of FIG. 3.

FIG. 3 is a drawing depicting a second circuit configuration 20 in accordance with embodiments of the present invention, and FIG. 4 is a timing diagram associated with the operation of the circuit configuration 20 of FIG. 3. In this example, similarly as in the previous embodiment, the circuit 20 is configured as a TFT circuit that includes multiple p-type transistors (T1-T7). In this embodiment, there again are two capacitors, including the storage capacitor $C_{st}$ and the programming capacitor $C_{pg}$. The circuit elements drive a light-emitting device, such as for example an OLED. The light-emitting device (OLED) has an associated internal capacitance, which again is represented in the circuit diagram as $C_{oled}$. The OLED further is connected to the first power supply ELVSS as is conventional. In addition, although the embodiments are described principally in connection with an OLED as the light-emitting device, comparable principles may be used with display technologies that employ other types of light-emitting devices, including for example micro LEDs and quantum dot LEDs.

Similarly as in the previous embodiment, T1 is a drive transistor that is an analogue TFT, and T2-T7 are digital switch TFTs. In this exemplary embodiment, T2 is a double-gate TFT as a preferred embodiment, although T2 alternatively may be a single gate TFT.

Referring to the TFT circuit 20 in combination with the timing diagram of FIG. 4, the TFT circuit 20 also operates to perform in four phases: an initialization phase, a compensation phase, a data programming phase, and an emission phase for light emission.

During the previous emission phase, the EMI(n) signal level has a low voltage value, so transistors T4 and T6 are on, and light emission is being driven by the input driving voltage VDD connected to the drive transistor T1, whereby the actual current applied to the OLED is determined by the voltage at the gate of the drive transistor. The SCAN and SCAND signal levels have a high voltage value so transistors T2, T3, T5 and T7 are off. Next at the beginning of the initialization phase, the SCAN (n−1) signal level is changed from a high voltage value to a low voltage value, causing transistor T3 to be turned on. An initialization voltage, INIT, is applied at the anode of the OLED. The INIT voltage is set to lower than the threshold voltage of the OLED, and thus the INIT voltage does not cause light emission when applied at the anode of the OLED.

Next during the initialization phase, the SCAN (n) signal level is changed from a high voltage value to a low voltage value, causing the transistor T2 to be turned on. As transistor T2 is turned on, the top plate of the storage capacitor, $C_{st}$, and thus also the gate of the drive transistor (node N1), is connected to the INIT voltage through transistors T4 and T3. The node N1 is initialized to the initialization voltage, INIT. Consequently, the drive transistor T1 is diode-connected through transistor T2 such that the drive transistor T1 is operated with its gate and a second terminal (e.g., source or drain) being electrically connected.

Next the SCAN (n+1) signal level is changed from the high voltage value to the low voltage value. The bottom plate of the storage capacitor, $C_{st}$, and the top plate of the programming capacitor, $C_{pg}$, are electrically connected to the reference voltage VREF. Effectively, the VREF electrically isolates the storage capacitor, $C_{st}$, from the programming capacitor, $C_{pg}$. With the two capacitors effectively isolated from each other, the threshold compensation and data programming phases can be performed independently of each other, which permits minimizing the one horizontal time as desired, while maintaining accurate and effective threshold compensation.

The TFT circuit 20 next is operable in a threshold compensation phase, during which the threshold voltage of the drive transistor T1 is compensated. For such phase, the EMI(n) signal level is changed from a low voltage value to a high voltage value, causing transistors T4 and T6 to be turned off. As transistor T4 is turned off, the drain and gate of the diode-connected transistor T1 and the top plate of the storage capacitor, $C_{st}$, thus are disconnected from the anode of the OLED, thereby electrically isolating the OLED. As the transistor T6 is turned off, the bottom plate of the programming capacitor, $C_{pg}$, is disconnected from the reference voltage, VREF, and becomes floating so that threshold compensation and data programming may be performed independently of each other.

Preferably, to have effective voltage threshold compensation of the drive transistor T1, the voltage at the gate of the drive transistor again should satisfy the following condition:

$$V_{DD}-V_{N1}>|V_{TH}|+\Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$, requirement.

The TFT circuit 20 next is operable in a data programming phase. The SCAND(n) signal level is changed from the high voltage value to the low voltage value, causing transistor T7 to be turned on, which electrically connects the data voltage input to the programming capacitor. The data signal is applied at the bottom plate of the data programming capacitor, $C_{pg}$. The data voltage, VDAT, is changed from the value for another pixel (e.g. the previous row of the display DATA(n−1)) to the data value for the current pixel (e.g. the current row of the display DATA(n)), which is applied to the data programming capacitor $C_{pg}$. Then the SCAND(n) signal level is changed from the low voltage value to the high voltage value, causing transistor T7 to be turned off. With T7 turning off, the bottom plate of the capacitor, $C_{pg}$, is disconnected from the data line. As the top plate of the programming capacitor is connected to the reference voltage, the data voltage is programmed to the data programming capacitor. VDAT then may be set to a data value for a next pixel DATA (n+1).

Then SCAN (n) signal level then is changed from the low voltage value to the high voltage value, causing transistor T2 to be turned off. With T2 turning off, the drive transistor is no longer diode-connected, and the node "N1" is floating. The voltage at the gate of the drive transistor is $V_{DD}-|V_{TH}|$.

The circuit configuration 20 of the embodiment of FIG. 3 differs from the circuit configuration 10 of the embodiment in FIG. 1 with respect to performance of the programming phase. For the programming phase in the circuit configuration 20, a dedicated signal line—SCAND—is applied at the gate of the transistor T7 to electrically connect the data voltage VDAT to the bottom plate of the programming capacitor $C_{pg}$. By using a dedicated SCAND signal line, a short pulse is readily achieved to minimize the one horizontal time 1H as shown in the timing diagram of FIG. 4, rather than relying on overlapping SCAN signals from different rows in combination as performed in the previous embodiment. The embodiment of FIG. 3 has an advantage of using only a single transistor (T7) to electrically connect VDAT to the programming capacitor $C_{pg}$, but requires the additional dedicated SCAND line to perform the programming phase. Similarly, the SCAND programming time can be applied any time during which the VREF electrically isolates the storage capacitor, $C_{st}$, from the programming capacitor, $C_{pg}$.

The TFT circuit 20 next is operable in an emission phase during which the OLED is capable of emitting light. The SCAN (n+1) signal level is changed from the low voltage value to the high voltage value, causing transistor T5 to be turned off, and accordingly the capacitors $C_{st}$ and $C_{pg}$ become series connected to the gate of the drive transistor T1. Then the EMI(n) signal is changed from the high voltage value to the low voltage value, causing transistors T6 and T4 to be turned on. With transistor T6 turning on, the VREF is applied at the bottom plate of the capacitor $C_{pg}$. The voltage at the bottom plate of the capacitor $C_{pg}$ is changed from VDAT to VREF. As the capacitors $C_{st}$ and $C_{pg}$ are now series connected and the top plate is floating, the same amount of voltage $V_{REF}$–$V_{DAT}$ is changed at the top of the capacitor Cat through the series connection of the programming capacitor $C_{pg}$.

With this voltage change, the gate voltage of the drive transistor T1 becomes $$V_{DD} - |V_{TH}| + V_{REF} - V_{DAT}$$

With transistor T4 turning on, the drain of the drive transistor T1 is connected to the anode of the OLED. The current that flows through the OLED is $$I_{OLED} = \frac{\beta}{2}(V_{DD} + V_{TH} + V_{REF} - V_{DAT} - V_{DD} - V_{TH})^2 = \frac{\beta}{2}(V_{REF} - V_{DAT})^2$$

$$\text{where } \beta = \mu_n \cdot C_{ox} \cdot \frac{W}{L},$$

$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Figure 5:
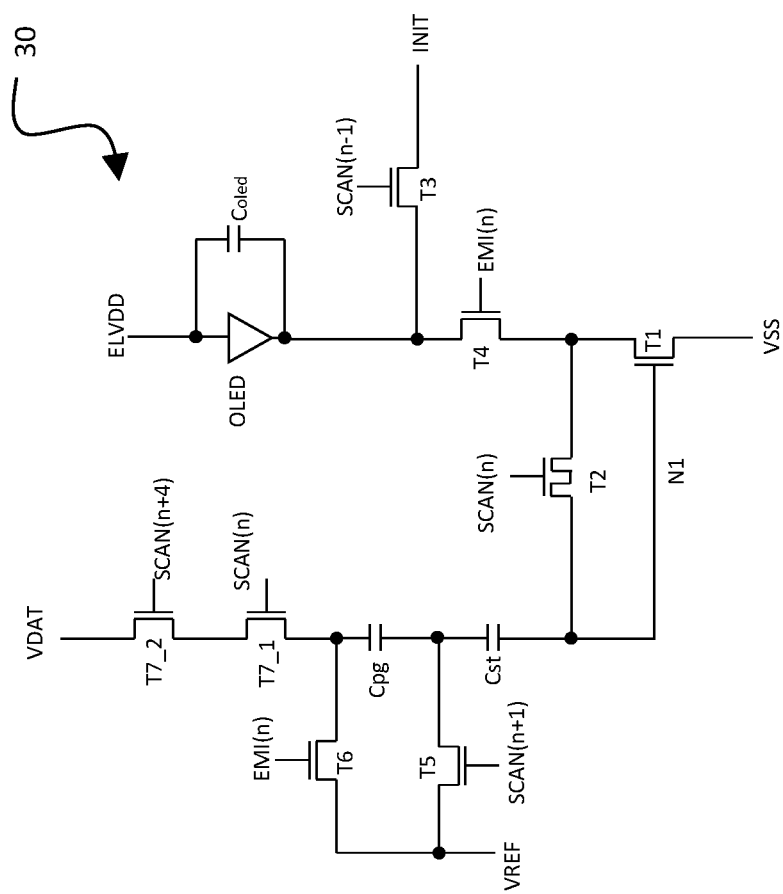
FIG. 5 is a drawing depicting a third circuit configuration in accordance with embodiments of the present invention.
Figure 6:
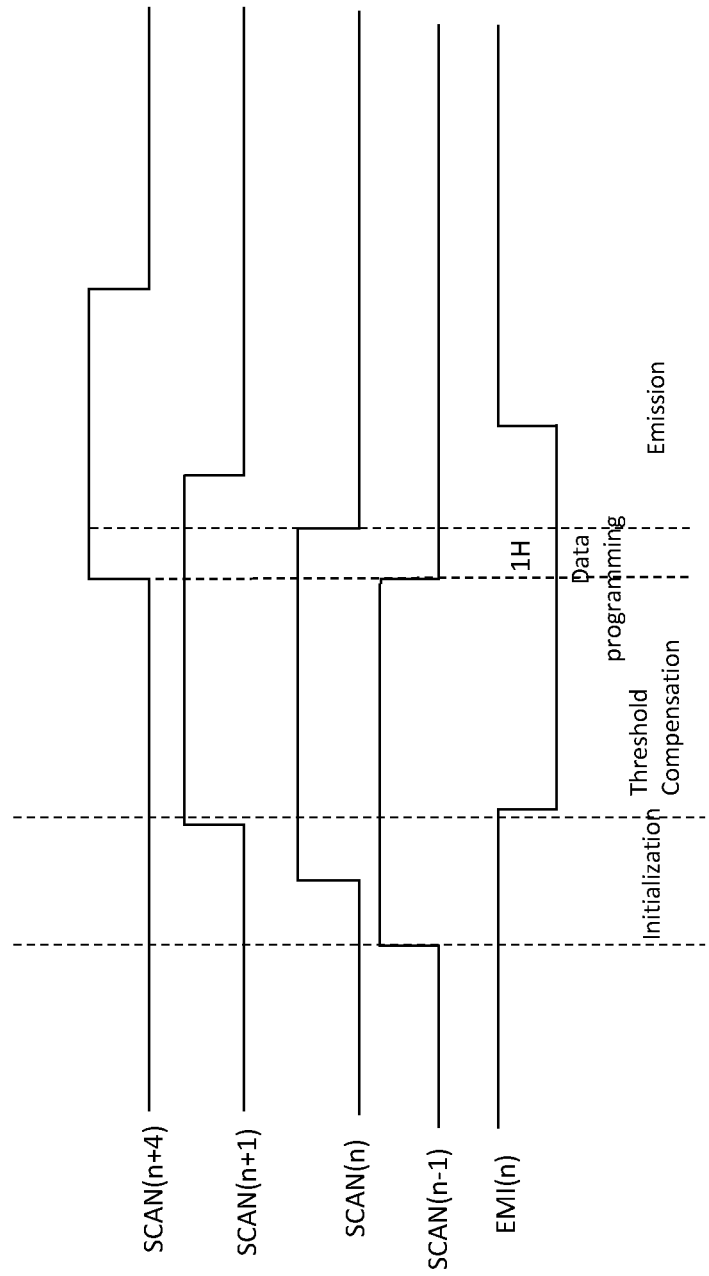
FIG. 6 is a drawing depicting a timing diagram associated with the operation of the circuit of FIG. 5.

FIG. 5 is a drawing depicting a third circuit configuration 30 in accordance with embodiments of the present invention, and FIG. 6 is a timing diagram associated with the operation of the circuit configuration 30 of FIG. 5. The circuit configuration of FIG. 5 operates comparably as the circuit configuration 10 of FIG. 1, except that the circuit configuration 30 employs n-type transistors rather than p-type transistors. As is known in the art, the drive properties of an OLED may be more suitable for one or other of p-type versus n-type transistors, and the principles of the present invention are applicable to either type of configuration. Accordingly, in this example of FIG. 5, the circuit 30 is configured as a TFT circuit that includes multiple n-type transistors T1-T7_2 and two capacitors including a storage capacitor $C_{st}$ and a programming capacitor $C_{pg}$. The circuit elements drive a light-emitting device, such as for example an OLED. The light-emitting device (OLED) again has an associated internal capacitance, which again is represented in the circuit diagram as $C_{oled}$. The OLED further is connected to the first power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs.

Similarly as in the previous embodiments, T1 is a drive transistor that is an analogue TFT, and transistors T2-T7_2 are digital switch TFTs. In this exemplary embodiment, T2 is a double-gate TFT as a preferred embodiment, although T2 alternatively may be a single gate TFT.

Referring to the TFT circuit 30 in combination with the timing diagram of FIG. 6, the TFT circuit 30 also operates to perform in four phases: an initialization phase, a compensation phase, a data programming phase and an emission phase for light emission. As referenced above, the circuit configuration of FIG. 5 operates comparably as the circuit configuration 10 of FIG. 1, except that the circuit configuration 30 employs n-type transistors rather than p-type transistors. Accordingly, the principal difference of operation is the relative voltage levels of the input signals (i.e., high voltage versus low voltage values) being set to operate with n-type transistors.

In this embodiment, during the previous emission phase, the EMI(n) signal level has a high voltage value, so transistors T4 and T6 are on, and light emission is driven by the input voltage VSS connected to the drive transistor T1, with the amount of current to the light-emitting device being based on the gate voltage of the drive transistor. The SCAN signal levels initially have a low voltage value so transistors T2, T3, T5, T7_1 and T7_2 are off. Next at the beginning of the initialization phase, the SCAN (n−1) signal level is changed from a low voltage value to a high voltage value, causing transistor T3 to be turned on. An initialization voltage, INIT, is applied at the cathode of the OLED. The INIT voltage is set to higher than ELVDD minus the threshold voltage of the OLED, and thus the INIT voltage does not cause light emission when applied at cathode of the OLED.

Next during the initialization phase, the SCAN (n) signal level is changed from a low voltage value to a high voltage value, causing transistors T2 and T7_1 to be turned on. As transistor T2 is turned on, the bottom plate of the storage capacitor, $C_{st}$, and thus also the gate of the drive transistor (node N1), is connected to the INIT voltage through transistors T4 and T3. The node N1 is initialized to the initialization voltage, INIT. Consequently, the drive transistor T1 is diode-connected through transistor T2 such that the drive transistor T1 is operated with its gate and a second terminal (e.g., source or drain) being electrically connected. The transistor T7_1 is turned on and ready for the data programming phase.

Next the SCAN (n+1) signal level is changed from the low voltage value to the high voltage value. The top plate of the storage capacitor, $C_{st}$, and the bottom plate of the programming capacitor, $C_{pg}$, are electrically connected to the reference voltage VREF. Effectively, the VREF electrically isolates the storage capacitor, $C_{st}$, from the programming capacitor, $C_{pg}$. With the two capacitors effectively isolated from each other, the threshold compensation and data programming phases can be performed independently of each other, which permits minimizing the one horizontal time as desired, while maintaining accurate and effective threshold compensation.

The TFT circuit 30 next is operable in a threshold compensation phase, during which the threshold voltage of the drive transistor T1 is compensated. For such phase, the EMI(n) signal level is changed from a high voltage value to a low voltage value, causing transistors T4 and T6 to be turned off. As transistor T4 is turned off, the drain and gate of the diode-connected transistor T1 and the bottom plate of the storage capacitor, $C_{st}$, thus are disconnected from the cathode of the OLED, thereby electrically isolating the OLED. As the transistor T6 is turned off, the top plate of the programming capacitor, $C_{pg}$, is disconnected from the reference voltage, VREF and becomes floating so that threshold compensation and programming may be performed independently of each other.

Preferably, to have effective voltage threshold compensation of the drive transistor T1, the voltage at the gate of the drive transistor should satisfy the following condition:

$$V_{N1} - V_{SS} > |V_{TH}| + \Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

The TFT circuit 30 next is operable in a data programming phase. The SCAN (n+4) signal level is changed from the low voltage value to the high voltage value, causing transistor T7_2 to be turned on, which electrically connects the data voltage input to the programming capacitor. The data signal is applied at the top plate of the data programming capacitor, $C_{pg}$. The data voltage, VDAT, is changed from the value for another pixel (e.g. the previous row of the display DATA(n−1)) to the data value for the current pixel (e.g. the current row of the display DATA(n)). Then the SCAN (n) signal level is changed from the high voltage value to the low voltage value, causing transistors T2 and T7_1 to be turned off. With T7_1 turning off, the top plate of the capacitor, $C_{pg}$, is disconnected from the data line. As the bottom plate of the programming capacitor is connected to the reference voltage, the data voltage has been programmed to the data programming capacitor. With T2 turning off, the drive transistor is no longer diode-connected, and the node "N1" is floating. The voltage at the gate of the drive transistor is $V_{SS} + |V_{TH}|$, and VDAT then may be set to a data value for a next pixel DATA(n+1).

Similarly as in the embodiment of FIG. 1, for the programming phase in the embodiment of FIG. 5, SCAN signals applied to different rows are employed to electrically connect the data voltage VDAT to the top plate of the programming capacitor $C_{pg}$. By using SCAN signals from different rows in combination, a short programming pulse results from overlap of the SCAN signals, thereby minimizing the 1H time as shown in the timing diagram of FIG. 6. Although in this embodiment, the SCAN (n) and SCAN (n+4) are used to control the switch transistors T7_1 and T7_2 to generate the short programming pulse, the SCAN signals from other rows can be used. The generated short programming pulse can be applied any time during which the VREF electrically isolates the storage capacitor, $C_{st}$, from the programming capacitor, $C_{pg}$. This embodiment has an advantage of using existing signal lines, but requires the two transistors T7_1 and T7_2 to electrically connect VDAT to the programming capacitor $C_{pg}$.

The TFT circuit 30 next is operable in an emission phase during which the OLED is capable of emitting light. The SCAN (n+1) signal level is changed from the high voltage value to the low voltage value, causing transistor T5 to be turned off, and accordingly the capacitors $C_{st}$ and $C_{pg}$ become series connected to the gate of the drive transistor. Then the EMI(n) signal is changed from the low voltage value to the high voltage value, causing transistors T6 and T4 to be turned on. With transistor T6 turning on, the VREF is applied at the top plate of the capacitor $C_{pg}$. The voltage at the top plate of the capacitor $C_{pg}$ is changed from VDAT to VREF. As the capacitors $C_{st}$ and $C_{pg}$ are now series connected and the bottom plate is floating, the same amount of voltage $V_{REF} - V_{DAT}$ is changed at the bottom of the storage capacitor Cat through the series connection of the programming capacitor $C_{pg}$.

With this voltage change, the gate voltage of the drive transistor T1 becomes $$V_{SS} + |V_{TH}| + V_{REF} - V_{DAT}$$

With transistor T4 turning on, the drain of the drive transistor T1 is connected to the cathode of the OLED. The current that flows through the OLED is $$I_{OLED} = \frac{\beta}{2}(V_{SS} + V_{TH} + V_{REF} - V_{DAT} - V_{SS} - V_{TH})^2 = \frac{\beta}{2}(V_{REF} - V_{DAT})^2$$

$$\text{where } \beta = \mu_n \cdot C_{ox} \cdot \frac{W}{L},$$

$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Figure 7:
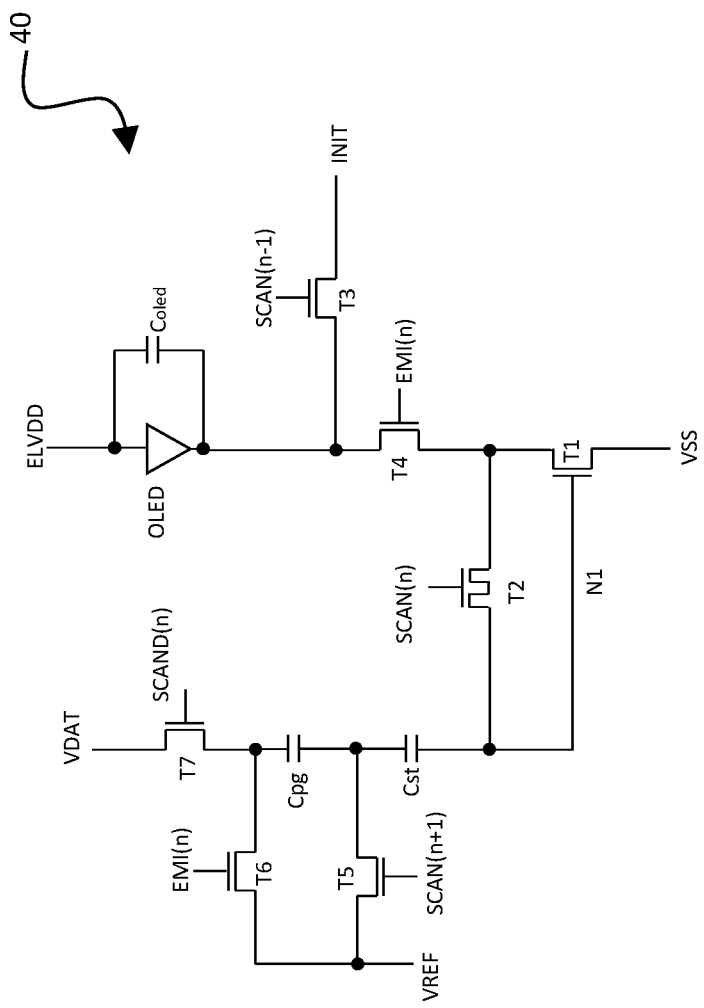
FIG. 7 is a drawing depicting a fourth circuit configuration in accordance with embodiments of the present invention.

FIG. 7 is a drawing depicting a fourth circuit configuration 40 in accordance with embodiments of the present invention, and FIG. 8 is a timing diagram associated with the operation of the circuit configuration 40 of FIG. 7. The circuit configuration 40 of FIG. 7 operates comparably as the circuit configuration 20 of FIG. 3, except that the circuit configuration 40 employs n-type transistors rather than p-type transistors. As referenced above, as is known in the art, the drive properties of an OLED may be more suitable for one or other of p-type versus n-type transistors, and the principles of the present invention are applicable to either type of configuration. Accordingly, in this example, the circuit 40 is configured as a TFT circuit that includes multiple n-type transistors (T1-T7). In this embodiment, there are two storage capacitors, including the storage capacitor $C_{st}$ and the programming capacitor $C_{pg}$. The circuit elements drive a light-emitting device, such as for example an OLED. The light-emitting device (OLED) has an associated internal capacitance, which again is represented in the circuit diagram as $C_{oled}$. The OLED further is connected to the first power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs.

Similarly as in the previous embodiment, T1 is a drive transistor that is an analogue TFT, and T2-T7 are digital switch TFTs. In this exemplary embodiment, T2 is a double-gate TFT as a preferred embodiment, although T2 alternatively may be a single gate TFT.

Referring to the TFT circuit 40 in combination with the timing diagram of FIG. 8, the TFT circuit 40 also operates to perform in four phases: an initialization phase, a compensation phase, a data programming phase, and an emission phase for light emission. As referenced above, the circuit configuration of FIG. 7 operates comparably as the circuit configuration 20 of FIG. 3, except that the circuit configuration 40 employs n-type transistors rather than p-type transistors. Accordingly, the principal difference of operation is the relative voltage levels of the input signals (i.e., high voltage versus low voltage values) being set to operate with n-type transistors.

During the previous emission phase, the EMI(n) signal level has a high voltage value, so transistors T4 and T6 are on, and light emission is being driven by the input voltage VSS connected to the drive transistor T1, with the current to the OLED being set by the gate voltage of the drive transistor. The SCAN and SCAND signal levels have low voltages values so transistors T2, T3, T5 and T7 are off. Next at the beginning of the initialization phase, the SCAN (n−1) signal level is changed from a low voltage value to a high voltage value, causing transistor T3 to be turned on. An initialization voltage, INIT, is applied at the cathode of the OLED. The INIT voltage is set to higher than ELVDD minus the threshold voltage of the OLED, and thus the INIT voltage does not cause light emission when applied at the anode of the OLED.

Next during the initialization phase, the SCAN (n) signal level is changed from a low voltage value to a high voltage value, causing the transistor T2 to be turned on. As transistor T2 is turned on, the bottom plate of the storage capacitor, $C_{st}$, and thus also the gate of the drive transistor (node N1), is connected to the INIT voltage through transistors T4 and T3. The node N1 is initialized to the initialization voltage, INIT. Consequently, the drive transistor T1 is diode-connected through transistor T2 such that the drive transistor T1 is operated with its gate and a second terminal (e.g., source or drain) being electrically connected.

Next the SCAN (n+1) signal level is changed from the low voltage value to the high voltage value. The top plate of the storage capacitor, $C_{st}$, and the bottom plate of the programming capacitor, $C_{pg}$, are electrically connected to the reference voltage, VREF. Effectively, the VREF electrically isolates the storage capacitor, $C_{st}$, from the programming capacitor, $C_{pg}$. With the two capacitors effectively isolated from each other, the threshold compensation and data programming phases can be performed independently of each other, which permits minimizing the one horizontal time as desired, while maintaining accurate and effective threshold compensation.

The TFT circuit 40 next is operable in a threshold compensation phase, during which the threshold voltage of the drive transistor T1 is compensated. For such phase, the EMI(n) signal level is changed from a high voltage value to a low voltage value, causing transistors T4 and T6 to be turned off. As transistor T4 is turned off, the drain and gate of the diode-connected transistor T1 and the bottom plate of the storage capacitor, $C_{st}$, thus are disconnected from the cathode of the OLED, thereby electrically isolating the OLED. As the transistor T6 is turned off, the top plate of the programming capacitor, $C_{pg}$, is disconnected from the reference voltage, VREF, and becomes floating so that threshold compensation and data programming may be performed independently of each other.

Preferably, to have effective threshold voltage compensation of the drive transistor T1, the voltage at the gate of the drive transistor should satisfy the following condition:

$$V_{N1} - V_{SS} > |V_{TH}| + \Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$, requirement.

The TFT circuit 40 next is operable in a data programming phase. The SCAND(n) signal level is changed from the low voltage value to the high voltage value, causing transistor T7 to be turned on which electrically connects the data voltage input to the programming capacitor. The data signal is applied at the top plate of the data programming capacitor, $C_{pg}$. The data voltage, VDAT, is changed from the value for another pixel (e.g. the previous row of the display DATA (n−1)) to the data value for the current pixel (e.g. the current row of the display DATA(n)). Then the SCAND(n) signal level is changed from the high voltage value to the low voltage value, causing transistor T7 to be turned off. With T7 turning off, the top plate of the capacitor, $C_{pg}$, is disconnected from the data line. As the bottom plate of the programming capacitor is connected to the reference voltage, the data voltage is programmed to the data programming capacitor. VDAT then may be set to a data value for a next pixel DATA (n+1).

Then SCAN (n) signal level is changed from the high voltage value to the low voltage value, causing transistor T2 to be turned off. With T2 turning off, the drive transistor is no longer diode-connected, and the node "N1" is floating. The voltage at the gate of the drive transistor is $V_{SS}+|V_{TH}|$.

The circuit configuration 40 of the embodiment of FIG. 7 differs from the circuit configuration 30 of the embodiment in FIG. 5 (and likewise the embodiment of FIG. 1) with respect to performance of the programming phase. For the programming phase in the circuit configuration 40, a dedicated signal line—SCAND—is applied at the gate of the transistor T7 to electrically connect the data voltage VDAT to the top plate of the programming capacitor $C_{pg}$. By using a dedicated SCAN signal line, a short pulse is readily achieved to minimize the one horizontal time 1H as shown in the timing diagram of FIG. 8, rather than relying on overlapping SCAN signals from different rows in combination as performed in the previous embodiment. The embodiment of FIG. 7 has an advantage of using only a single transistor (T7) to electrically connect VDAT to the programming capacitor $C_{pg}$, but requires the additional dedicated SCAND line to perform the programming phase. Similarly, the SCAND programming time can be applied any time during which the VREF electrically isolates the storage capacitor, $C_{st}$, from the programming capacitor, $C_{pg}$.

The TFT circuit 40 next is operable in an emission phase during which the OLED is capable of emitting light. The SCAN (n+1) signal level is changed from the high voltage value to the low voltage value, causing transistor T5 to be turned off. The capacitors $C_{st}$ and $C_{pg}$ become series connected to the gate of the drive transistor T1. Then the EMI(n) signal is changed from the low voltage value to the high voltage value, causing transistors T6 and T4 to be turned on. With transistor T6 turning on, the VREF is applied at the top plate of the capacitor $C_{pg}$. The voltage at the top plate of the capacitor $C_{pg}$ is changed from VDAT to VREF. As the capacitors $C_{st}$ and $C_{pg}$ are now series connected and the bottom plate is floating, the same amount of voltage $V_{REF}-V_{DAT}$ is changed at the bottom plate of the capacitor $C_{st}$ through the series connection of the programming capacitor $C_{pg}$.

With this voltage change, the gate voltage of the drive transistor T1 becomes $V_{SS} + |V_{TH}| + V_{REF} - V_{DAT}$ With transistor T4 turning on, the drain of the drive transistor is connected to the cathode of the OLED. The current that flows through the OLED is $$I_{OLED} = \frac{\beta}{2}(V_{SS} + V_{TH} + V_{REF} - V_{DAT} - V_{SS} - V_{TH})^2 = \frac{\beta}{2}(V_{REF} - V_{DAT})^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

The pixel circuit configurations of the various embodiments are capable of compensating the threshold voltage variations of the drive transistor with ultra-short one horizontal time (1H) of less than about 2 μs, which is shorter as compared to conventional configurations, with additionally removing the possible memory effects associated with the OLED device and drive transistor from the previous frame. The ultra-short 1H time (<2 μs) is achieved via the separation of threshold compensation of the drive transistor and data programming phase in the manner described above. The threshold compensation time is dictated by the drive transistor characteristics and is difficult to reduce further without degrading the compensation accuracy. By separating the threshold compensation and data programming phases, a longer time can be allocated to threshold compensation for compensation accuracy, while the programming phase is reduced to have an ultra-short 1H time (<2 μs). In addition, although the data programming phase is described above as following the threshold compensation phase, in practice the data programming phase can be performed during any portion of the overall SCAN period of a frame, such as before the threshold compensation phase, during the threshold compensation phase whereby the data programming phase overlaps the compensation phase, or after the threshold compensation phase. The described configurations also prevent data line noise from interfering with the voltage at the drive transistor gate during emission.

An aspect of the invention, therefore, is a pixel circuit for a display device operable in a compensation phase, a programming phase, and an emission phase, whereby the one horizontal time is minimized while maintaining accurate compensation of the threshold voltage of the drive transistor. In exemplary embodiments, the pixel circuit includes: a drive transistor configured to control an amount of current to a light-emitting device during the emission phase depending upon a voltage applied to a gate of the drive transistor; a second transistor connected to the gate of the drive transistor and a second terminal of the drive transistor, such that when the second transistor is in an on state the drive transistor becomes diode-connected such that the gate and the second terminal of the drive transistor are electrically connected through the second transistor, wherein a threshold voltage of the drive transistor is compensated during the compensation phase while the drive transistor is diode connected; wherein the light-emitting device is connected at a first node to the second terminal of the drive transistor and at a second node to a first voltage input; a storage capacitor having a first plate connected to the gate of the drive transistor, and a programming capacitor having a first plate connected to a second plate of the storage capacitor, and a second plate of the programming capacitor is electrically connected to a data voltage input during the data programming phase. The second plate of the storage capacitor and the first plate of the programming capacitor are connectable to a reference voltage input to perform the compensation phase independently of the programming phase, and the storage capacitor and the programming capacitor are series connected to the gate of the drive transistor during the emission phase. The pixel circuit may include one or more of the following features, either individually or in combination.

In an exemplary embodiment of the pixel circuit, the pixel circuit further includes a third transistor connected between the first node of the light-emitting device and an initialization voltage input, wherein the pixel circuit further is operable in an initialization phase during which the initialization voltage is applied to the light emitting device and to the gate of the drive transistor while diode connected.

In an exemplary embodiment of the pixel circuit, the pixel circuit further includes a fourth transistor that is connected between the second terminal of the drive transistor and the first node of the light-emitting device, wherein the light-emitting device is electrically connected to the drive transistor through the fourth transistor during the emission phase and electrically isolated from the drive transistor during the compensation and data programming phases.

In an exemplary embodiment of the pixel circuit, the pixel circuit further includes a fifth transistor that is connected between the reference voltage input, and the second plate of the storage capacitor and the first plate of the programming capacitor.

In an exemplary embodiment of the pixel circuit, the pixel circuit further includes a sixth transistor that is connected between the reference voltage input and the second plate of the programming capacitor.

In an exemplary embodiment of the pixel circuit, the pixel circuit further includes a seventh transistor that connected between the second plate of the programming capacitor and the data voltage input.

In an exemplary embodiment of the pixel circuit, the pixel circuit further includes a seventh transistor and an eighth transistor, wherein the seventh transistor is connected between the second plate of the programming capacitor and the eighth transistor, and the eighth transistor is connected between the seventh transistor and the data voltage input.

In an exemplary embodiment of the pixel circuit, the pixel circuit further includes the light-emitting device, wherein the light-emitting device is electrically connected to the drive transistor during the emission phase and electrically isolated from the drive transistor during the compensation and data programming phases.

In an exemplary embodiment of the pixel circuit, the light-emitting device is one of an organic light-emitting diode, a micro light-emitting diode (LED), or a quantum dot LED.

In an exemplary embodiment of the pixel circuit, the transistors are p-type transistors.

In an exemplary embodiment of the pixel circuit, the transistors are n-type transistors.

Another aspect of the invention is a method of operating a pixel circuit accordingly to any of the embodiments, whereby the one horizontal time is minimized while maintaining accurate compensation of the threshold voltage of the drive transistor. In exemplary embodiments, the method of operating includes the steps of providing a pixel circuit according to any of the embodiments; performing a compensation phase to compensate a threshold voltage of the drive transistor comprising diode-connecting the drive transistor through the second transistor and applying the reference voltage at the second plate of the storage capacitor and the first plate of the programming capacitor, and at the second plate of the programming capacitor, thereby electrically isolating the programming capacitor from the storage capacitor; performing a data programming phase to program the data voltage to the programming capacitor comprising applying the data voltage at a second plate of the programming capacitor; and performing an emission phase during which light is emitted from the light-emitting device comprising applying the reference voltage at the second terminal of the programming capacitor, wherein the storage capacitor and the programming capacitor are series-connected to the gate of the drive transistor, and applying a driving voltage through the drive transistor to the light emitting device. The method may include one or more of the following features, either individually or in combination.

In an exemplary embodiment of the method of operating, the data programming phase overlaps or is before or after the compensation phase.

In an exemplary embodiment of the method of operating, a duration of the data programming phase is shorter than a duration of the compensation phase.

In an exemplary embodiment of the method of operating, the method further includes performing an initialization phase comprising, prior to the compensation and data programming phases, applying an initialization voltage to a first node of the light emitting device and to the gate of the drive transistor via the diode-connection through the second transistor.

In an exemplary embodiment of the method of operating, the pixel circuit comprises two transistors connected between the data voltage input and the second plate of the programming capacitor, wherein during the data programming phase, SCAN signals from different rows of pixels respectively are applied to gates of the two transistors to apply the data voltage at the second plate of the programming capacitor.

In an exemplary embodiment of the method of operating, the pixel circuit comprises a single transistor connected between the data voltage input and the second plate of the programming capacitor, wherein during the data programming phase, a dedicated SCAN signal is applied to a gate of the single transistor to apply the data voltage at the second plate of the programming capacitor.

In an exemplary embodiment of the method of operating, the transistors are p-type transistors.

In an exemplary embodiment of the method of operating, the transistors are n-type transistors.

In an exemplary embodiment of the method of operating, the light-emitting device is one of an organic light-emitting diode, a micro light-emitting diode (LED), or a quantum dot LED.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—first circuit configuration
20—second circuit configuration
30—third circuit configuration
40—fourth circuit configuration
T1-T7 (T7_1 and T7_2)—multiple transistors
OLED—organic light emitting diode (or generally light-emitting device)
$C_{st}$—storage capacitor
$C_{pg}$—storage capacitor
$C_{oled}$—internal capacitance of OLED
N1—Node at drive transistor
VDAT—data voltage
VDD—power supply
VSS—power supply
ELVSS—power supply
ELVDD—power supply
VREF—reference voltage supply
INIT—initialization voltage supply
SCAN/SCAND/EMI—control signals

What is claimed is:

1. A pixel circuit for a display device operable in a compensation phase, a data programming phase, and an emission phase, the pixel circuit comprising:
 a drive transistor configured to control an amount of current to a light-emitting device during the emission phase depending upon a voltage applied to a gate of the drive transistor;
 a second transistor connected to the gate of the drive transistor and a second terminal of the drive transistor, such that when the second transistor is in an on state the drive transistor becomes diode-connected such that the gate and the second terminal of the drive transistor are electrically connected through the second transistor, wherein a threshold voltage of the drive transistor is compensated during the compensation phase while the drive transistor is diode connected;

wherein the light-emitting device is electrically connected at a first node to the second terminal of the drive transistor during the emission phase, and is connected at a second node to a first voltage input;
a storage capacitor having a first plate directly connected to the gate of the drive transistor, and
a programming capacitor having a first plate directly connected to a second plate of the storage capacitor at a common node connection, and a second plate of the programming capacitor is electrically connected to a data voltage input during the data programming phase;
wherein the common node connection of the second plate of the storage capacitor and the first plate of the programming capacitor is electrically connectable to a reference voltage input to perform the compensation phase independently of the programming phase, and the storage capacitor and the programming capacitor are series connected to the gate of the drive transistor during the emission phase.

2. The pixel circuit of claim 1, further comprising a third transistor connected between the first node of the light-emitting device and an initialization voltage input, wherein the pixel circuit further is operable in an initialization phase during which the initialization voltage is applied to the light emitting device and to the gate of the drive transistor while diode connected.

3. The pixel circuit of claim 1, further comprising a fourth transistor that is connected between the second terminal of the drive transistor and the first node of the light-emitting device, wherein the light-emitting device is electrically connected to the drive transistor through the fourth transistor during the emission phase and electrically isolated from the drive transistor during the compensation and data programming phases.

4. The pixel circuit of claim 1, further comprising a fifth transistor that is directly connected at a first terminal to the reference voltage input and at a second terminal to the common node connection of the second plate of the storage capacitor and the first plate of the programming capacitor.

5. The pixel circuit of claim 4, further comprising a sixth transistor that is directly connected at a first terminal to the reference voltage input and at a second terminal to the second plate of the programming capacitor.

6. The pixel circuit of claim 1, further comprising a seventh transistor that connected between the second plate of the programming capacitor and the data voltage input.

7. The pixel circuit of claim 1, further comprising a seventh transistor and an eighth transistor, wherein the seventh transistor is connected between the second plate of the programming capacitor and the eighth transistor, and the eighth transistor is connected between the seventh transistor and the data voltage input.

8. The pixel circuit of claims, further comprising the light-emitting device, wherein the light-emitting device is electrically connected to the drive transistor during the emission phase and electrically isolated from the drive transistor during the compensation and data programming phases.

9. The pixel circuit of claim 1, wherein the light-emitting device is one of an organic light-emitting diode, a micro light-emitting diode (LED), or a quantum dot LED.

10. The pixel circuit of claim 1, wherein the transistors are p-type transistors.

11. The pixel circuit of claim 1, wherein the transistors are n-type transistors.

12. A method of operating a pixel circuit for a display device comprising the steps of:
providing a pixel circuit comprising:
a drive transistor configured to control an amount of current to a light-emitting device depending upon a voltage applied to a gate of the drive transistor;
a second transistor connected to the gate of the drive transistor and a second terminal of the drive transistor, such that when the second transistor is in an on state the drive transistor becomes diode-connected such that the gate and the second terminal of the drive transistor are electrically connected through the second transistor;
a storage capacitor having a first plate directly connected to the gate of the drive transistor, and
a programming capacitor having a first plate directly connected to a second plate of the storage capacitor at a common node connection, and a second plate of the programming capacitor is electrically connectable to a data voltage input;
performing a compensation phase to compensate a threshold voltage of the drive transistor comprising diode-connecting the drive transistor through the second transistor and applying the reference voltage at the common node connection of the second plate of the storage capacitor and the first plate of the programming capacitor, thereby electrically isolating the programming capacitor from the storage capacitor;
performing a data programming phase to program the data voltage to the programming capacitor comprising applying the data voltage at a second plate of the programming capacitor; and
performing an emission phase during which light is emitted from the light-emitting device comprising applying the reference voltage at the second terminal of the programming capacitor, wherein the storage capacitor and the programming capacitor are series-connected to the gate of the drive transistor, and applying a driving voltage through the drive transistor to the light emitting device.

13. The method of operating of claim 12, wherein the data programming phase overlaps or is before or after the compensation phase.

14. The method of operating of claim 12, wherein a duration of the data programming phase is shorter than a duration of the compensation phase.

15. The method of operating of claim 12, further comprising performing an initialization phase comprising, prior to the compensation and data programming phases, applying an initialization voltage to a first node of the light emitting device and to the gate of the drive transistor via the diode-connection through the second transistor.

16. The method of operating of claim 12, wherein the pixel circuit comprises two transistors connected between the data voltage input and the second plate of the programming capacitor, wherein during the data programming phase, SCAN signals from different rows of pixels respectively are applied to gates of the two transistors to apply the data voltage at the second plate of the programming capacitor.

17. The method of operating of claim 12, wherein the pixel circuit comprises a single transistor connected between the data voltage input and the second plate of the programming capacitor, wherein during the data programming phase, a dedicated SCAN signal is applied to a gate of the single transistor to apply the data voltage at the second plate of the programming capacitor.

18. The method of operating of claim 12, wherein the transistors are p-type transistors.

19. The method of operating of claim 12, wherein the transistors are n-type transistors.

20. The method of operating method of claim 12, wherein the light-emitting device is one of an organic light-emitting diode, a micro light-emitting diode (LED), or a quantum dot LED.

* * * * *